United States Patent [19]

Ota et al.

[11] 4,410,994
[45] Oct. 18, 1983

[54] SEMICONDUCTOR LASER

[75] Inventors: Chuichi Ota, Fuchu; Yasuharu Suematsu, Kawasaki; Yoshio Itaya, Tokyo, all of Japan

[73] Assignee: Kokusai Denshin Denwa Kabushiki Kaisha, Tokyo, Japan

[21] Appl. No.: 302,705

[22] Filed: Sep. 16, 1981

Related U.S. Application Data

[63] Continuation-in-part of Ser. No. 10,965, Feb. 9, 1979, abandoned.

[30] Foreign Application Priority Data

Feb. 28, 1978 [JP] Japan .................................. 53-21466

[51] Int. Cl.³ .............................................. H01S 3/19
[52] U.S. Cl. ..................................... 372/45; 357/17; 357/61
[58] Field of Search ...................... 372/45, 44; 357/16, 357/17, 61

[56] References Cited

U.S. PATENT DOCUMENTS 4,287,485 9/1981 Hsieh ..................................... 372/45

OTHER PUBLICATIONS

H. Nagai et al., "InP-GaxIn$_{1-x}$AsyP$_{1-y}$ Double-Heterostructure for 1.5 μm Wavelength", *Appl. Phys. Lett.* 32(4), Feb. 15, 1978, pp. 234-236.

R. E. Nahory et al., "Threshold Characteristics and Extended Wavelength Operation of GaAs$_{1-x'}$Sb$_x$-'/Al$_y$Ga$_{1-y}$As$_{1-x}$Sb$_x$ Double-Heterostructure Lasers", *Journal of Applied Physics*, vol. 48, No. 9, Sep. 1977, pp. 3988-3990.

*Primary Examiner*—James W. Davie
*Attorney, Agent, or Firm*—Robert E. Burns; Emmanuel J. Lobato; Bruce L. Adams

[57] ABSTRACT

A semiconductor laser having a multi-layer film which is inclusive of an active layer and formed on an InP substrate, in which at least one layer adjacent to the active layer is formed of a material which is a composition having a larger band gap than InP and whose component ratio is so selected as to match with the lattice constant of InP, thereby to ensure that minority carriers injected into the active layer efficiently contribute to laser operation. The material has a composition including at least three elements in addition to InP.

3 Claims, 21 Drawing Figures

Fig. 7
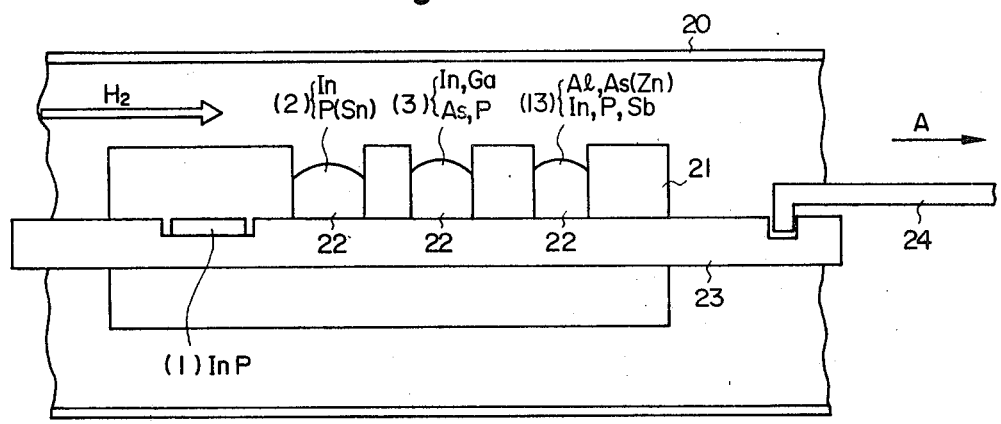
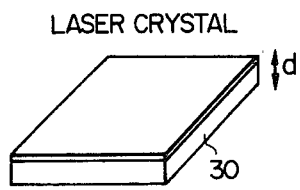
Fig. 8A
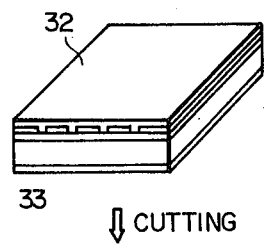
Fig. 8D
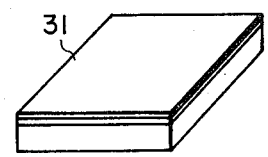
Fig. 8B
Fig. 8E
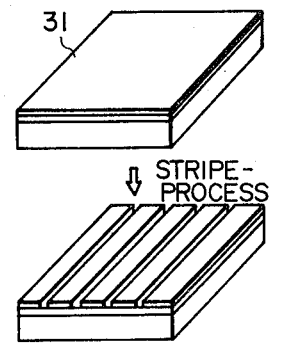
Fig. 8C
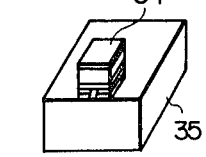
Fig. 8F

SEMICONDUCTOR LASER

CROSS-REFERENCE TO RELATED APPLICATION

This application is a continuation-in-part of our copending application, Ser. No. 010,965, filed on Feb. 9, 1979 and now abandoned.

BACKGROUND OF THE INVENTION

This invention relates to a semiconductor laser for use as a light source for optical communications.

A DH-structure laser having a GaInAsP layer formed on an InP substrate is now intensively studied and developed as a semiconductor laser capable of emitting a light in a wavelength region in which the loss of a fused silica fiber shows minimum attenuation. However, the conventional DH-structure laser has a temperature characteristic bent at a temperature.

SUMMARY OF THE INVENTION

This invention is to provide a semiconductor laser which is designed so that the lasing threshold value vs. temperature characteristic does not bend.

In accordance with the present invention, there is provided a semiconductor laser having a multi-layer film including an active layer and formed on an InP substrate, in which at least one layer adjacent to the active layer is formed of a material which is a composition having a larger band gap than InP and whose component ratio is so selected as to match with the lattice constant of InP, thereby to ensure that minority carriers injected into the active layer efficiently contribute to laser operation. The material has a composition including at least three elements in addition to InP, such as AlAsInPSb or GaInPAlSb.

BRIEF DESCRIPTION OF THE DRAWINGS

The invention will be described in detail below in comparison with the prior art with reference to the accompanying drawings, in which:

FIG. 7 is a section explanatory of a fabricating device used in this invention; and FIGS. 8A, 8B, 8C, 8D, 8E and 8F are perspective views explanatory of fabrication processes used for practical usage of embodiment of this invention.

DETAILED DESCRIPTION

Figure 1:
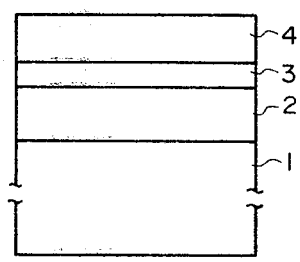
FIG. 1 is a cross-sectional diagram showing a conventional DH-structure laser having a GaInAsP layer formed on an InP substrate.
Figure 2:
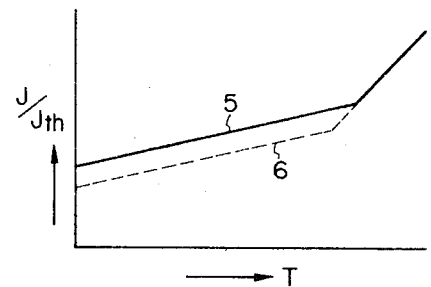
FIG. 2 is a graph showing the lasing threshold value vs. temperature characteristic of the DH-structure laser having a GaInAsP layer formed on an InP substrate.

To make a difference between this invention and the prior art clear, an example of a conventional laser will first be described. A conventional laser of this kind has, as shown in FIG. 1, a three-layer, double hetero structure which has an n-type InP layer (2), a GaInAsP active layer (3) and a p-type InP layer (4) epitaxially grown on an n-type InP substrate (1). An optical cavity is formed in connection with the active layer (3) as usual. Metallic electrodes respectively provided at respective outsides of the n-type InP substrate (1) and the p-type InP layer (4) are omitted from FIG. 1 for simple illustration. The experimental lasing threshold current vs. temperature characteristic of the laser of the above construction is shown in FIG. 2, in which the abscissa represents the temperature and the ordinate represents the threshold current at room temperature J/Jth normalized by a threshold current Jth. The solid line (5) indicates the temperature characteristic of a laser having a lasing wavelength of 1.30 μm and the broken line (6) indicates the temperature characteristic of a laser having a lasing wavelength of 1.24 μm. The temperature characteristics (5) and (6) sharply bend at temperature 260° and 250°, respectively, and the threshold suddenly rises above these temperatures.

Figure 3:
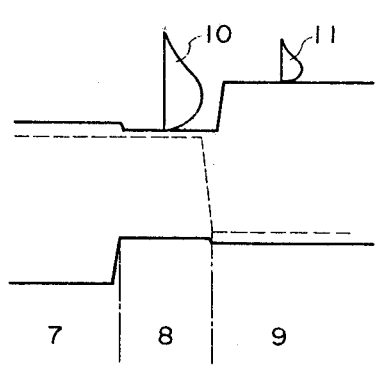
FIG. 3 is a diagram showing its energy gap characteristic when it is biased.

The inventors of the present invention have made the following study on the prior art. FIG. 3 shows energy gaps of the DH-structure laser, which has a GaInAsP layer formed on an InP substrate when it is biased. Reference numeral (7) indicates an n-type InP layer having an energy gap of 1.35 eV; (8) designates a GaInAsP layer serving as an active layer, which has an energy gap of 0.96 eV at a lasing wavelength of 1.3 μm; and (9) identifies a p-type InP layer serving as a barrier layer. Reference numeral (10) denotes the distribution of minority carriers injected into the active layer, and (11) represents the distribution of carriers having run over the barrier. The broken line indicates the Fermi level. The cause of the abovesaid demerit of the prior art is that as temperature rises, the carriers spread in the forbidden band and run over the barrier formed by the energy gaps, as shown in FIG. 3. This is also supported by experimental results shown in FIG. 2 in which the characteristic of the laser of the longer lasing wavelength bends at a higher temperature than in the case of the shorter wavelength.

In view of the above, in this invention, a layer of a composition having a larger band gap than InP is grown as a barrier layer to overlie or underlie the GaInAsP layer serving as an active layer so as to provide for heightened carrier trapping effect. Further, since an InP substrate is used, the compositions of the respective layers are so selected as to match with InP in lattice constant.

Figure 4:
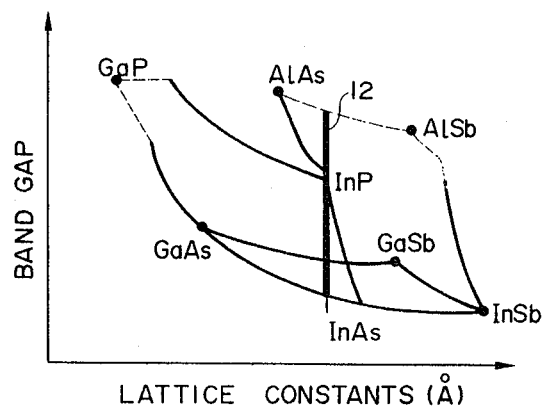
FIG. 4 is a characteristic diagram showing the relationships between the lattice constants of various semiconductor materials and band gaps.

FIG. 4 shows the relationship between the lattice constants of various kinds of semiconductor materials and the band gap. The thick line (12) indicates the range of compositions which match with InP in lattice constant. Materials having a larger band gap than InP on the thick line (12) are obtainable with such compositions as AlAsInPSb, i.e. a mixed crystal of AlAs, AlSb and InP, and GaInPAlSb, i.e. a mixed crystal of GaP, AlAs and InP, and their component ratios are so selected as to achieve the abovesaid lattice constant matching.

Figure 5:
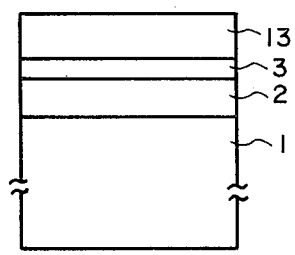
FIGS. 5, 9, 10, 11, 12, 14, 15 and 16 are cross-sectional diagrams illustrating embodiments of this invention.

At first, an embodiment using $Al_xIn_{1-x}(As_ySb_{1-y})_zP_{1-z}$ will be described. FIG. 5 shows a structure in which the n-type InP layer (2), a GaInAsP layer (3) and a p-type $Al_xIn_{1-x}(As_ySb_{1-y})_zP_{1-z}$ layer (13) are successively, epitaxially grown on the n-type InP substrate (1). A plus electrode and a minus electrode are provided respectively on the n-type InP substrate (1) and the p-type $Al_xIn_{1-x}(As_ySb_{1-y})_zP_{1-z}$ layer (13). There were proposed many types of structure to confine the current. One of the most typical structures is the stripe-shaped electrode. Conventional techniques can be adopted as a laser element as described below.

In this case, the mole fractions x, y and z of the p-type $Al_xIn_{1-x}(As_ySb_{1-y})_zP_{1-z}$ layer (13) must be determined to match the lattice constant of the layer (13) with the lattice constant of the n-type InP substrate (1). These mole fractions x, y and z can be determined in accordance with Vagard's Law to satisfy the following equation:

$$0.054xyz + 0.421yz - 0.075zx + 0.418x - 0.61z = 0$$

Figure 6:
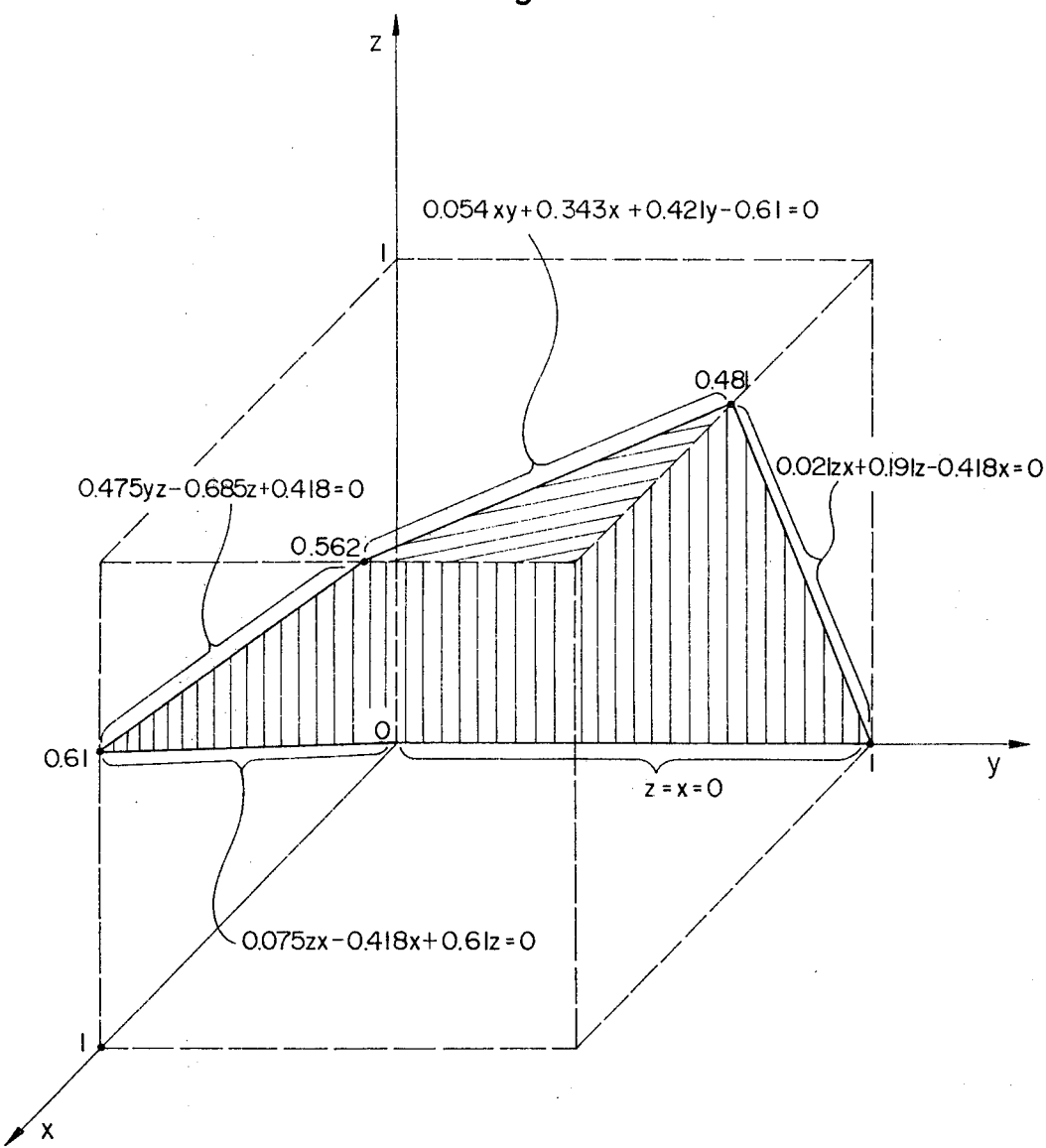
FIGS. 6 and 13 are diagrams explanatory of mole fractions in embodiments of this invention.

The above equation can be satisfied by the mole fractions included in a region hatched in FIG. 6. More particularly describing, the mole fractions are selected in view of the crystal manufacturing the characteristics. If the fraction x=0.60 by way of example, it results in a condition where y=0.40 and x=0.53.

A laser having such a structure can be produced by a liquid phase epitaxial grown method. An example of a liquid phase epitaxial grown apparatus is shown in FIG. 7, which comprises a quartz tube 20, a graphite boat 21 having reservoirs 22, a graphite slider 23 carrying thereon an InP substrate (1). Respective elements of the layers (2), (3) and (13) are held in the corresponding reservoirs 22 as shown in the state of melt at a high temperature such as 650° C. under a $H_2$ gas atmosphere in the quartz tube 20. The slider 23 is pulled along an arrow A by a quartz bar 24 in lowering the temperature of the melt, the layers (2), (3) and (13) are successively grown on the InP substrate (1) as shown in FIG. 5. In the reservoirs 22, (Sn) and (Zn) are respectively n-type and p-type dopants.

A laser can be fabricated as shown in FIGS. 8A to 8F by the use of the above-mentioned substrate (1) with an active layer, which laser crystal is indicated by reference 30 in FIG. 8A and has a thickness of 70 to 100 μm. An insulator layer 31 such as $SiO_2$ is provided on the laser crystal 30 by a CVD method or a spattering method as shown in FIG. 8B. To limit the current flowing regions, stripe-parts of the insulator layer 31 are removed as shown in FIG. 8C to provide stripes of 5 to 20 μm width in accordance with photolythography techniques. Thereafter, an Au-Zn layer 32 and an Au-Sn layer (33) are provided by evaporative deposition as a plus electrode and a minus electrode, respectively, as shown in FIG. 8D. A laser pallet is then cut out as shown in FIG. 8E in accordance with creavage in a square of 0.3 mm. The laser pellet is installed on a heat-radiation 35 base such as diamond, and necessary read lines 34 are provided as shown in FIG. 8F to provide a laser element of about 1 mm square.

Other production methods, such as a vapor phase epitaxy or a molecular beam epitaxy can be also adopted in place of the liquid phase epitaxy.

Figure 9:
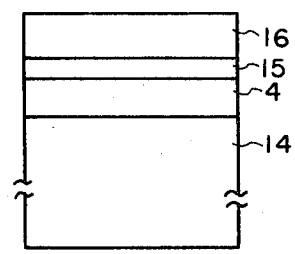
Figure 10:
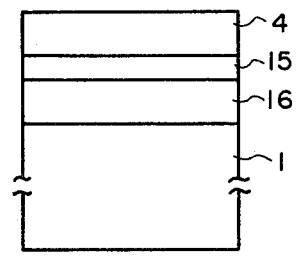
Figure 11:
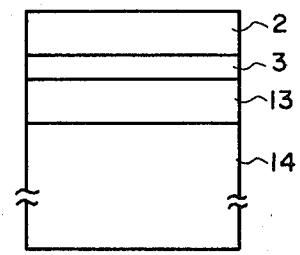

FIG. 9 shows an example in which a p-type InP layer (4), an n-type GaInAsP layer (15) and an n-type AlAsInPSb layer (16) are epitaxially grown on a p-type InP substrate (14); FIG. 10 shows an example in which an n-type AlAsInPSb layer (16), an n-type GaInAsP layer (15) and a p-type InP layer (4) are epitaxially grown on the n-type InP substrate (1); and FIG. 11 shows an example in which a p-type AlAsInPSb layer (13), a p-type GaInAsP layer (3) and the n-type InP layer (2) are epitaxially grown on the p-type InP substrate (14).

Figure 12:
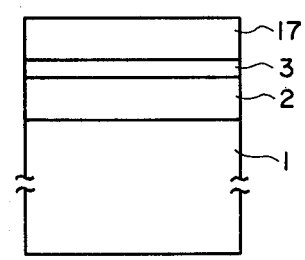
Figure 13:
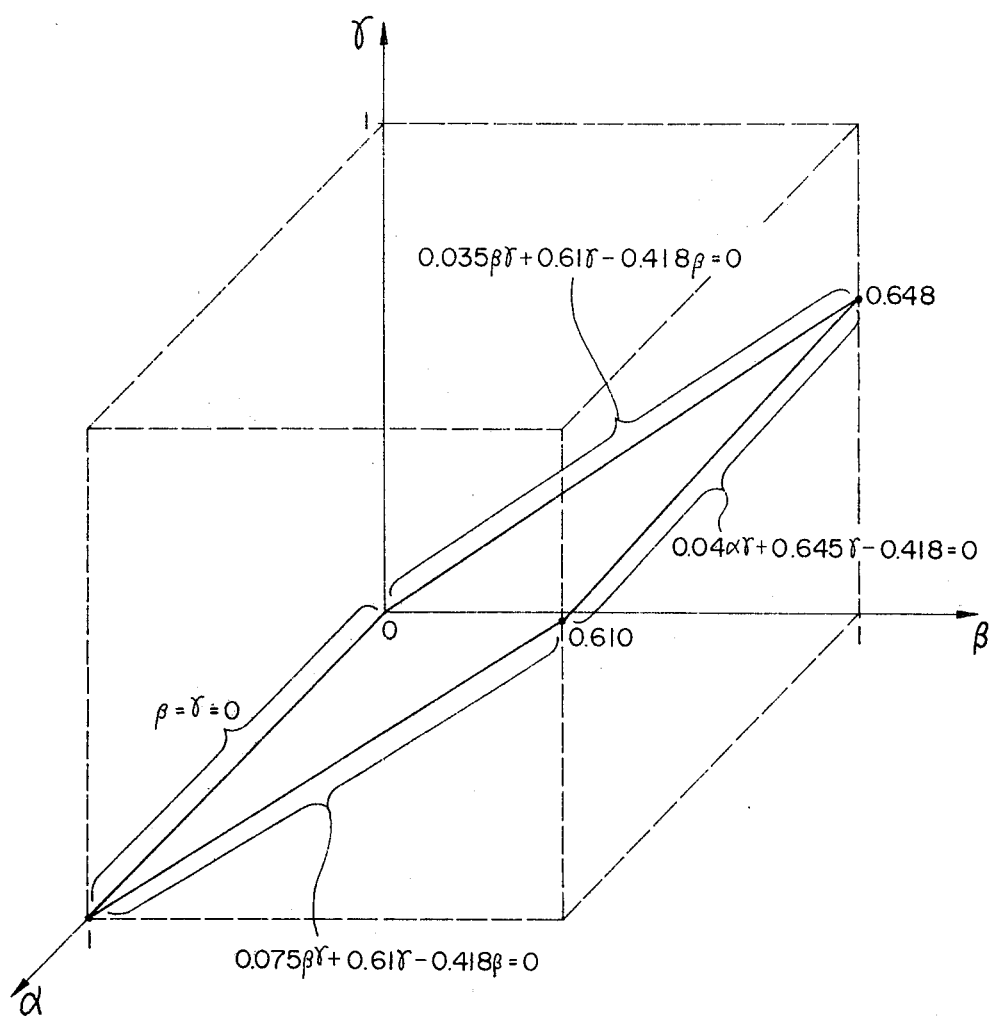

Next, embodiments employing the GaInPAlSb will be described. FIG. 12 shows an example in which an n-type InP layer (2), a p-type GaInAsP layer (3) and a p-type $(Al_\alpha Ga_{1-\alpha})_\beta In_{1-\beta} Sb_{65} P_{1-\gamma}$ layer (17) are epitaxially grown on the n-type InP substrate (1). In this case, the fractions $\alpha$, $\beta$ and $\gamma$ can be determined by Vagard's Law to satisfy the following equation:

$$0.04\alpha\beta\gamma + 0.035\beta\gamma + 0.61\gamma + 0.418\beta = 0$$

as shown in FIG. 13. By way of example, $\alpha = 0.60$, $\beta = 0.7$ and $\gamma = 0.45$.

Figure 14:
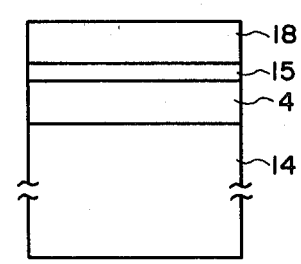
Figure 15:
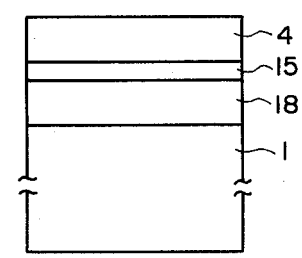
Figure 16:
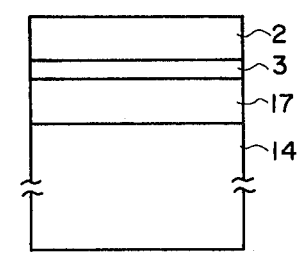

FIG. 14 shows an example in which a p-type InP layer (14), an n-type InAsP layer (15) and an n-type $(Al_\alpha Ga_{1-\alpha})_\beta In_{1-\beta} Sb_\gamma P_{1-\gamma}$ layer (18) are epitaxially grown on the p-type InP substrate; FIG. 15 shows an example in which the n-type $(Al_\alpha Ga_{1-\alpha})_{62} In_{1-\beta} Sb_{65} P_{1-\gamma}$ layer (18), an n-type GaInAsP layer (15) and a p-type InP layer (4) are epitaxially grown on the n-type InP substrate (1); and FIG. 16 shows an example in which a p-type $(Al_{60} Ga_{1-\alpha})_{62} In_{1-\beta} Sb_\gamma P_{1-\gamma}$ layer (17), the p-type GaInAsP layer (3) and the n-type InP layer (2) are epitaxially grown on the p-type InP substrate (4).

As described above, in this invention, a layer of a large energy barrier height is grown to overlie and/or underlie an active layer, by which the carrier trapping effect is increased to thereby improve the temperature characteristic of the threshold value. Accordingly, the threshold value at room temperature can be reduced, which ensures a stable lasing operation also at temperature higher than room temperature.

What we claim is:

1. In a semiconductor laser comprising: a multi-layer film inclusive of an active layer and formed on an InP substrate, a metallic electrode means provided at the outside of the multilayer film for flowing a lasing current in the multi-layer film, one of the electrode means being provided on said InP substrate, and optical cavity means provided in connection with the active layer, the improvement comprising at least one layer adjacent to the active layer and formed of a material which is a composition having a larger band gap than InP and whose component ratio is selected as to match with the lattice constant of InP, the material being selected from the group consisting of AlAsInPSb and GaInPAlSb, thereby to ensure that minority carriers injected into the active layer efficiently contribute to laser operation.

2. A semiconductor laser according to claim 1, wherein the material is AlAsInPSb.

3. A semiconductor laser according to claim 1, wherein the material is GaInPAlSb.

* * * * *